(12) United States Patent
Katti et al.

(10) Patent No.: US 9,923,025 B2
(45) Date of Patent: Mar. 20, 2018

(54) MAGNETORESISTIVE RANDOM ACCESS MEMORY (MRAM) DIE INCLUDING A MAGNETIC FIELD SENSING STRUCTURE

(71) Applicant: Honeywell International Inc., Morristown, NJ (US)

(72) Inventors: Romney R. Katti, Shorewood, MN (US); Bryan C. Westberg, Delano, MN (US)

(73) Assignee: Honeywell International Inc., Morris Plains, NJ (US)

( * ) Notice: Subject to any disclaimer, the term of this patent is extended or adjusted under 35 U.S.C. 154(b) by 396 days.

(21) Appl. No.: 14/482,898

(22) Filed: Sep. 10, 2014

(65) Prior Publication Data

US 2016/0071904 A1    Mar. 10, 2016

(51) Int. Cl.

| | |
|---|---|
| *H01L 29/82* | (2006.01) |
| *H04R 23/00* | (2006.01) |
| *H01L 27/22* | (2006.01) |
| *H01L 43/02* | (2006.01) |
| *H01L 43/08* | (2006.01) |
| *H01L 43/12* | (2006.01) |
| *H01L 43/10* | (2006.01) |
| *G11C 11/16* | (2006.01) |
| *H01L 29/06* | (2006.01) |
| *G01R 33/038* | (2006.01) |

(52) U.S. Cl.
CPC ............ *H01L 27/222* (2013.01); *G11C 11/16* (2013.01); *H01L 43/02* (2013.01); *H01L 43/08* (2013.01); *H01L 43/10* (2013.01); *H01L 43/12* (2013.01); *G01R 33/038* (2013.01); *H01L 29/0665* (2013.01); *H01L 29/0673* (2013.01)

(58) Field of Classification Search
CPC ....... H01L 27/222; H01L 43/02; H01L 43/08; H01L 43/12; H01L 27/266; G01R 33/038; G01R 33/1207; G01R 33/0293
USPC ......... 257/418, 421.414, 422, 427, E27.003; 438/3, 48, 49, 50
See application file for complete search history.

(56) References Cited

U.S. PATENT DOCUMENTS

| | | | |
|---|---|---|---|
| 5,307,228 A | 4/1994 | Grasty | |
| 5,790,670 A * | 8/1998 | Bramlett | G08B 13/1409 200/43.09 |
| 6,111,403 A | 8/2000 | Yokotani et al. | |
| 6,507,187 B1 * | 1/2003 | Olivas | G01B 7/24 324/207.21 |
| 6,528,992 B2 | 3/2003 | Shinjo et al. | |
| 2003/0173957 A1 * | 9/2003 | Shen | G01D 5/2515 324/207.26 |
| 2006/0114084 A1 * | 6/2006 | Ruan | H01H 50/005 335/78 |
| 2012/0198242 A1 * | 8/2012 | Dalzell | G06F 21/55 713/190 |
| 2012/0206134 A1 * | 8/2012 | Fischer | G01R 33/091 324/244 |

(Continued)

*Primary Examiner* — Thinh T Nguyen (74) *Attorney, Agent, or Firm* — Shumaker & Sieffert, P.A.

(57) ABSTRACT

A magnetoresistive random access memory (MRAM) die may include a plurality of MRAM cells, and a magnetic field sensing structure. The magnetic field sensing structure may include a movable portion and a magnetic material attached to the movable portion. The movable portion may move in response to exposure of the magnetic material to an external magnetic field.

19 Claims, 5 Drawing Sheets

(56) References Cited

U.S. PATENT DOCUMENTS

| | | | | |
|---|---|---|---|---|
| 2012/0255357 A1* | 10/2012 | Chen | ............ | G01P 15/008 |
| | | | | 73/514.31 |
| 2013/0249545 A1* | 9/2013 | Horsley | ............ | G01R 33/091 |
| | | | | 324/252 |
| 2014/0312886 A1* | 10/2014 | Hirota | ............ | G01N 27/72 |
| | | | | 324/228 |
| 2015/0021727 A1* | 1/2015 | Lloyd | ............ | H01L 27/222 |
| | | | | 257/427 |
| 2016/0054400 A1* | 2/2016 | van Beek | ............ | G01C 17/28 |
| | | | | 324/259 |

\* cited by examiner

MAGNETORESISTIVE RANDOM ACCESS MEMORY (MRAM) DIE INCLUDING A MAGNETIC FIELD SENSING STRUCTURE

TECHNICAL FIELD

The disclosure relates to magnetoresistive random access memory (MRAM) and to magnetic field sensing devices for MRAM.

BACKGROUND

MRAM is a non-volatile memory technology in which data are stored using magnetic domains. MRAM may provide desirable read speeds, write speeds, and device longevity. Because of these characteristics, MRAM may be used in a variety of applications, such as long-term storage (e.g., in place of or as a complement to a hard disc drive or a solid state drive) or device memory (e.g., in place of or as a complement to dynamic random access memory (DRAM) and/or static random access memory (SRAM)). Because MRAM stores data using magnetic domains, data stored by MRAM may be erased or overwritten by external magnetic fields of sufficient strength.

SUMMARY

In general, the disclosure describes techniques and magnetic field sensing structures for detecting and indicating exposure of the magnetic field sensing structures to a magnetic field above a threshold magnetic field strength. In some examples, a magnetoresistive random access memory (MRAM) die may include a magnetic field sensing structure incorporated into the MRAM die. The magnetic field sensing structure may include a movable portion and at least one layer of magnetic material attached to the movable portion. The movable portion may be configured to move in response to the magnetic material being exposed to a magnetic field above a threshold magnetic field strength.

In some examples, the movable portion may be free to return to a previous position when the magnetic material is not exposed to a magnetic field. When the movable portion of the magnetic field sensing structure is at its initial position (e.g., at its original manufactured position), this may indicate that the magnetic material is not currently exposed to a magnetic field above the threshold magnetic field strength. Conversely, if the movable portion of the magnetic field sensing structure is not at its initial position e.g., has moved from its original manufactured position), this indicates that the magnetic material is currently exposed to a magnetic field above the threshold magnetic field strength. In some examples, the threshold magnetic field strength may be substantially equal to zero Oersteds (Oe).

In other examples, the movable portion may not be free to return to a previous position when the magnetic material is not exposed to a magnetic field. For example, the movable portion may be configured to break upon exposure of the magnetic material to a magnetic field above a threshold magnetic field strength. In these examples, if the movable portion is in the initial position, this may indicate that the magnetic material has not been exposed at any previous time to a magnetic field above the threshold magnetic field strength. However, when the movable portion of the magnetic field sensing structure is not in its initial position this indicates that the magnetic material has been or is being exposed to or a magnetic field greater than the threshold magnetic field strength. The threshold magnetic field strength may be substantially equal to zero Oe, or may be a predetermined value greater than zero Oe. For example, the threshold magnetic field strength may be selected to be a value above which an external magnetic field may modify the magnetic orientation of one or more layers of MRAM cells of the MRAM die. In this way, the magnetic field sensing structure may indicate whether MRAM cells have been exposed to a magnetic field greater than the threshold magnetic field strength. Exposure of the MRAM cells to a magnetic field greater than the threshold magnetic field strength may indicate tampering or modification of MRAM cells. Conversely, during a manufacturing process, if the MRAM cells have not been exposed to a magnetic field above a threshold magnetic field strength this may indicate an incomplete magnetic reorientation of one or more layers of the MRAM cells or magnetic structures used to reorient the MRAM cells.

In one example, the disclosure is directed to a magnetoresistive random access memory (MRAM) die. The MRAM die includes a plurality of MRAM cells, and a magnetic field sensing structure. The magnetic field sensing structure includes a movable portion and a magnetic material attached to the movable portion. The movable portion moves in response to exposure of the magnetic material to an external magnetic field.

In another example, the disclosure is directed to a method for forming a magnetic field sensing structure as part of a magnetoresistive random access memory (MRAM) die. The method for forming the magnetic field sensing structure includes forming a movable portion of the MRAM die, and attaching a magnetic material to the movable portion. The movable portion moves in response to exposure of the magnetic material to an external magnetic field.

The details of one or more examples are set forth in the accompanying drawings and the description below. Other features, objects, and advantages will be apparent from the description and drawings, and from the claims.

DETAILED DESCRIPTION

In general, the disclosure describes techniques and magnetic field sensing structures for detecting and indicating exposure of the magnetic field sensing structures to a magnetic field above a threshold magnetic field strength. In some examples, a magnetoresistive random access memory (MRAM die) may include a magnetic field sensing structure incorporated into the MRAM die. Incorporating the magnetic field sensing structure into the MRAM die may allow the magnetic field sensing structure to provide a visual indication of an external magnetic field near the MRAM die, compared to a magnetic field sensing structure that is separate from the MRAM die.

The magnetic field sensing structure includes a movable portion and at least one layer of magnetic material. For example, the movable portion of the magnetic field sensing structure may include a cantilever or a hinge and the magnetic material may include a linear magnetic material (e.g., a magnetic material that does not exhibit magnetic hysteresis). The movable portion of the magnetic field sensing structure may be configured to move in response to the magnetic material being exposed to a magnetic field above a threshold magnetic field strength.

In some examples, the movable portion may be free to return to or remain at a previous or predetermined position when the magnetic material is not exposed to a magnetic field. In other words, when the magnetic field sensing structure is at an initial position (e.g., the original manufactured position), this indicates that the magnetic material is not currently exposed to a magnetic field above the threshold magnetic field strength. Conversely, if the movable portion of the magnetic field sensing structure is not at its initial position (e.g., has moved from its original manufactured position), this indicates that the magnetic material is currently exposed to a magnetic field above the threshold magnetic field strength. In some examples, the threshold magnetic field strength may be substantially equal to zero Oe.

In other examples, the movable portion may not be free to return to a previous or predetermined position when the magnetic material is not exposed to a magnetic field. In some examples, if the movable portion is in the initial position, this may indicate that the magnetic material has not been exposed to a magnetic field above the threshold magnetic field strength. Conversely, if the movable portion is not in the initial position, this may indicate that the magnetic material has been exposed to a magnetic field above the threshold magnetic field strength. The threshold magnetic field strength may be equal to a predetermined value, such as substantially equal to zero Oe, or equal to a selected value that is greater than zero Oe.

In some examples, the movable portion may be configured to break upon exposure of the magnetic material to a magnetic field above the threshold magnetic field strength. For example, the movable portion may be configured to break upon exposure of the magnetic material to any magnetic field. In another example, the movable portion may be configured to break upon exposure of the magnetic material to a selected magnetic field strength above zero Oe.

In other examples, the movable portion may be configured to engage with a rack including a plurality of asymmetric teeth such that a ratchet is formed. In these examples, the movable portion may move in one direction but not return to a previous position. The teeth in the rack may be configured such that the movable portion moves past a respective tooth in response to being exposed to a magnetic field above a respective threshold magnetic field strength. In this way, each respective tooth in the ratchet may provide additional information regarding any magnetic field to which the magnetic material has been exposed. For example, when the movable portion is in a particular position out of a plurality of positions of the rack, this may indicate that the magnetic material has been exposed, currently or previously, to a magnetic field having a magnetic field strength greater than the respective threshold of a previous tooth and less than the respective threshold of the next tooth. In particular, this particular position of the plurality of positions may indicate the maximum magnetic field strength to which the magnetic material has been exposed.

In some examples, the threshold magnetic field strength or the respective threshold magnetic field strengths may be selected to be a value(s) above which an external magnetic field (e.g., an applied magnetic field) may modify the magnetic orientation of one or more layers of MRAM cells of the MRAM die. In this way, the magnetic field sensing structure may indicate whether MRAM cells have been exposed to a magnetic field greater than the threshold magnetic field strength(s). Exposure of the MRAM cells to a magnetic field greater than the threshold magnetic field strength(s) may indicate tampering or modification of MRAM cells. Conversely, during a manufacturing process, if the MRAM cells have not been exposed to a magnetic field above a threshold magnetic field strength(s) this may indicate an incomplete magnetic reorientation of one or more layers of the MRAM cells or magnetic structures used to reorient the MRAM cells.

The magnetic field sensing structure may be located anywhere in or on the MRAM die where detection of a magnetic field is desired. For example, the magnetic field sensing structure may be located within a covered well defined by the substrate of the MRAM die. By locating the magnetic field sensing structure in the covered well of the MRAM die, the magnetic field sensing structure is hidden from view, and may reduce the likelihood that a person tampering with the MRAM die will become aware of the magnetic field sensing structure.

Figure 1:
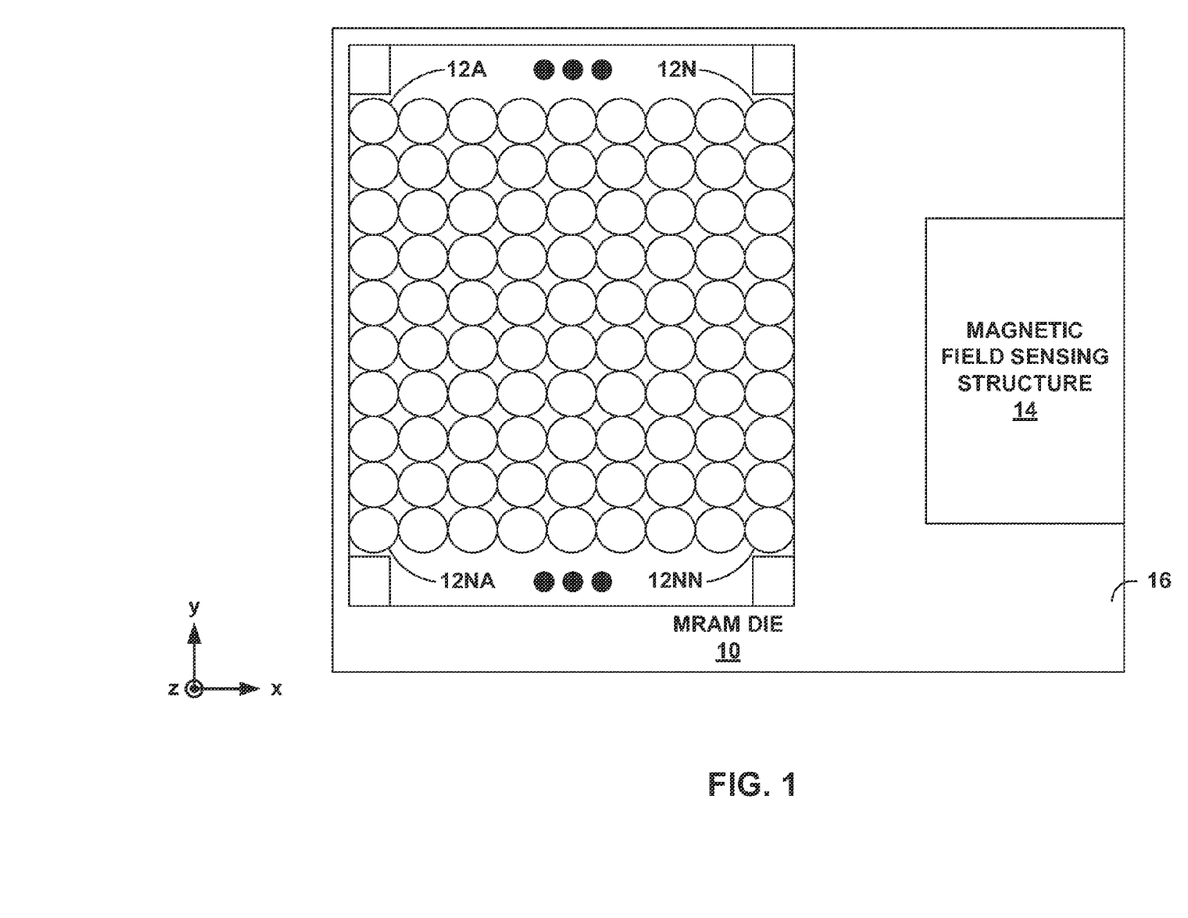
FIG. 1 is a conceptual diagram illustrating an example MRAM die that includes a magnetic field sensing structure.

FIG. 1 is a conceptual diagram illustrating an example MRAM die 10 that includes a magnetic field sensing structure 14. In some examples, MRAM die 10 may be an individual integrated circuit. MRAM die 10 includes an array of MRAM cells 12A-12NN (collectively "MRAM cells 12"). In the example of FIG. 1, MRAM cells 12 extend as a two-dimensional array.

MRAM die 10 may include a substrate and a plurality of layers on the substrate. The substrate may include a semiconductor material, such as bulk silicon, silicon on insulator (SOI), GaAs, or the like. The plurality of layers on the substrate may include, for example, layers included in MRAM cells 12, electrically conductive layers forming electrical interconnects between MRAM cells 12 and other circuitry of MRAM die 10 (e.g., transistors, etc.), dielectric or electrically insulating layers that electrically isolate various electrically conductive structures in MRAM die 10, and the like.

MRAM cells 12 are the individual structures that are configured to store data magnetically in MRAM die 10. For example, each of MRAM cells 12 may include a fixed magnetic layer, a tunnel barrier layer, and a free magnetic layer, among other layers. An orientation of the magnetic moment of the fixed magnetic layer is fixed at the temperatures and external magnetic fields in which MRAM die 10 is designed for use (e.g., by coupling to an antiferromagnetic layer). The orientation of the magnetic moment of the free magnetic layer may be switched by between two magnetically stable states, each state representing a bit (e.g., a 0 or 1).

In some examples, MRAM die 10 may utilize one or more write lines disposed near each of MRAM cells 12 to switch the orientation of the free magnetic layer of the respective one of MRAM cells 12 by applying a magnetic field to the free magnetic layer. In other examples, MRAM die 10 may utilize write lines electrically connected to respective ones of the MRAM cells 12 to conduct a spin-polarized current through one of MRAM cells 12 to write data to the respective one of MRAM cells 12 (e.g., in a spin-transfer torque (STI)-MRAM die). In either example, the orientation of the magnetic moment of the free magnetic layer, and, thus, the value of the bit stored in the respective one of MRAM cells 12, may be read by measuring an electrical resistance of the respective one of MRAM cells 12. For example, a higher measured electrical resistance may correspond to a logical state of "1," While a tower measured electrical resistance may correspond to a logical state of "0."

MRAM die 10 also includes at least one magnetic field sensing structure 14, which includes a movable portion and a magnetic material attached to the movable portion. Magnetic field sensing structure 14 is disposed adjacent to at least one of MRAM cells and is a part of MRAM die 10. FIG. 1 illustrates an example MRAM die 10 that includes a single magnetic field sensing structure 14 adjacent to MRAM cells 12. In other examples, MRAM die 10 may include more than one magnetic field sensing structure 14.

In the example illustrated in FIG. 1, magnetic field sensing structure 14 is disposed at first surface 16 of MRAM die 10. In some examples, first surface 16 of MRAM die 10 may be referred to as a front side of MRAM die 10. In some examples, an MRAM die 10 may include at least one magnetic field sensing structure 14 disposed at a second side of MRAM cells 12 (e.g., the back side of MRAM die 10), in addition to or as an alternative to at least one magnetic field sensing structure 14 disposed at first surface 16 of MRAM die 10. In some examples, MRAM die 10 additionally or alternatively may include a magnetic field sensing structure 14 disposed within an enclosed cavity or a well formed in MRAM die 10 (see, e.g., FIGS. 4A and 4B).

Magnetic field sensing structure 14 includes a movable portion and a magnetic material attached to the movable portion. The movable portion of magnetic held sensing structure 14 may be configured to be moved by the force exerted on the magnetic material when the magnetic material is exposed to a magnetic field. For example, the movable portion of magnetic field sensing structure 14 may be configured to move in response to the magnetic material being exposed to a magnetic field above a threshold magnetic field strength.

In some examples, at least a portion of magnetic field sensing structure 14 may be formed from the substrate of MRAM die 10. For example, the substrate of MRAM die 10 may include silicon, and the movable portion of magnetic field sensing structure 14 may include silicon. In some examples, the movable portion may include a hinged structure. The magnetic material may be attached to the hinged structure, and the hinged structure may be attached to MRAM die 10 by a hinge. In this way, the movable portion may be free to move in response to the magnetic material being exposed to a magnetic field.

In other examples, the movable portion may include a cantilever. For example, a silicon cantilever may be formed in the substrate of MRAM die 10. The magnetic material may be attached to at least a portion of the cantilever. In some examples, the cantilever may possess sufficient flexibility to be deformed (moved) in response to the magnetic material being exposed to a magnetic field. In other examples, the cantilever may be configured to break upon the magnetic material being exposed to a magnetic field greater than or equal to a threshold magnetic field strength.

The magnetic material of magnetic field sensing structure 14 may include any magnetic material that can exert sufficient force to move the movable portion in response to the magnetic material being exposed to a magnetic field of a predetermined (e.g., above a threshold value) magnetic field strength. The threshold magnetic field strength may be equal to a predetermined value, such as substantially equal to zero Oe, or equal to a selected value that is greater than zero Oe. In some examples, the magnetic material of magnetic field sensing structure 14 may be a linear magnetic material that exhibits relatively little magnetic hysteresis. This may result in the movement of the movable portion of magnetic field sensing structure 14 to be related to the magnetic field strength of the external magnetic field.

Additionally, the magnetic material may possess at least some magnetic permeability, such that the external magnetic field (e.g., an applied magnetic field) is substantially unaffected by the presence of the magnetic material of magnetic field sensing structure. For example, the magnetic material may possess a relative magnetic permeability of at least 10, at least about 100, or at least about 1,000. In some examples, the relative magnetic permeability of the magnetic material may be less than about 100,000 or less than 10,000. In some examples, the magnetic material may include a nickel-iron-molybdenum (NiFeMo) alloy.

Magnetic field sensing structure 14 may be configured to move in response to the magnetic material being exposed to an external magnetic field. In some examples, magnetic field sensing structure 14 may be free to move among a plurality of positions, depending on the magnetic field strength of the external magnetic field, and may be free to return to a previous position. For example, the movable portion may include a flexible cantilever or a hinged structure. The movable portion may be configured to rest at a predetermined position when no magnetic field is being applied to the magnetic material, and to move in response to the magnetic material being exposed to an external magnetic field. In some examples, the degree or amount that the movable portion moves may be related to the magnetic field strength of the external magnetic field. Because the movable portion is free in these examples to move among a plurality of positions, magnetic field sensing structure 14 may provide information regarding the current magnetic field to which the magnetic material is exposed.

In some examples, a magnetic field sensing structure 14 such as this may be used as a sensor during manufacturing of MRAM die 10. For example, during manufacture of MRAM die 10, MRAM die 10 may be exposed to one or more magnetic fields to orient selected layers of MRAM cells 12. Monitoring the magnitude of the magnetic field to which MRAM die 10 is exposed may be difficult. For example, the external magnetic field may be estimated by monitoring the current and voltage of an electromagnet used to generate the external magnetic field. However, this may not always be accurate, as a short circuit may cause inaccurate estimations, and the magnetic field is not measured at or near MRAM cells 12. In contrast, magnetic field sensing structure 14 is adjacent to MRAM cells 12 and the movement of the movable portion may be related to the magnetic field strength of the external magnetic field in a known manner, e.g., based on mechanical properties of the movable portion and magnetic properties of the magnetic material. For example, the mechanical properties of the movable portion that may affect the movement of the movable portion may include a thickness, width, length, effective thickness, effective width, and effective length of the movable portion, and a spring constant, a Young's modulus, and a Poisson's ratio of the material from which the movable portion is formed. In this way, magnetic field sensing structure 14 may be used to provide real-time information regarding magnetic fields to which MRAM die 10 (e.g., MRAM cells 12) are exposed during a manufacturing process.

In other examples, the movable portion of magnetic field sensing structure 14 may be configured to move among at least one position, depending on the magnetic field strength of the external magnetic field, but may be restrained from returning to a previous position. For example, the movable portion of magnetic field sensing structure 14 may be configured to break in response to the magnetic material being exposed to an external magnetic field greater or equal to a threshold magnetic field strength. Thus, the movable portion may move between a first (resting) position and a second (broken) position, and may not return to the first position after moving to the second position. In some examples, the threshold magnetic field strength may be selected based on a magnetic field strength that may cause changes to one or more layers of MRAM cells 12. In some examples, the threshold magnetic field strength may be substantially equal to zero Oe, and any exposure to a magnetic field may be above the threshold magnetic field strength. In other examples, the threshold magnetic field strength may be a magnetic field strength above zero Oe. For example, the threshold or predetermined magnetic field strength may be the magnetic field strength that magnetically reorients MRAM cells 12 or magnetic structures used to reorient MRAM cells 12. In this way, magnetic field sensing structure 14 may be configured to indicate whether MRAM die 10 has been exposed to an external magnetic field greater than or equal to the threshold magnetic field strength. Examples such as this may be used to indicate attempted tampering with MRAM die 10 by exposing MRAM die 10 to an external magnetic field.

The threshold magnetic field at which the movable portion breaks may be selected based on a number of factors. For example, the magnetic properties of the magnetic material and the volume of magnetic material attached to the movable portion may affect the threshold magnetic field at which the movable portion breaks. As other examples, the thickness, width, length, effective thickness, effective width, and effective length of the movable portion, and the spring constant, Young's modulus, Poisson's ratio, yield strength, and fracture point of the material from which the movable portion is formed may affect the threshold magnetic field at which the movable portion breaks.

In some examples, magnetic field sensing structure 14 may be configured to indicate further detail with regard to the maximum magnetic field to which the magnetic material has been exposed. For example, magnetic field sensing structure 14 may additionally include a rack including a plurality of asymmetric teeth, such that the movable portion and the rack form a ratchet. The movable portion may include a hinge or a cantilever. The rack including the plurality of asymmetric teeth may allow the movable portion to move in response to the magnetic material being exposed to an external magnetic field, but may prevent the movable portion from returning to a previous position. In these examples, the respective positions of the plurality of asymmetric teeth component may be selected such that the movable portion moves past a respective tooth in response to the magnetic material being exposed to an external magnetic field is greater than a respective threshold magnetic field strength. Similar to the examples in which the movable portion includes a cantilever configured to break, the examples in which magnetic field sensing structure 14 includes a ratchet may indicate that the magnetic material has been exposed to an external magnetic field greater than or equal to a threshold magnetic field. Additionally, a magnetic field sensing structure 14 including a ratchet may indicate that the maximum magnetic field to which the magnetic material has been exposed is less than the respective threshold magnetic field strength associated with the next tooth. Examples such as this may be used to indicate attempted tampering with MRAM die 10 by exposing MRAM die 10 to an external magnetic field.

Figure 2A:
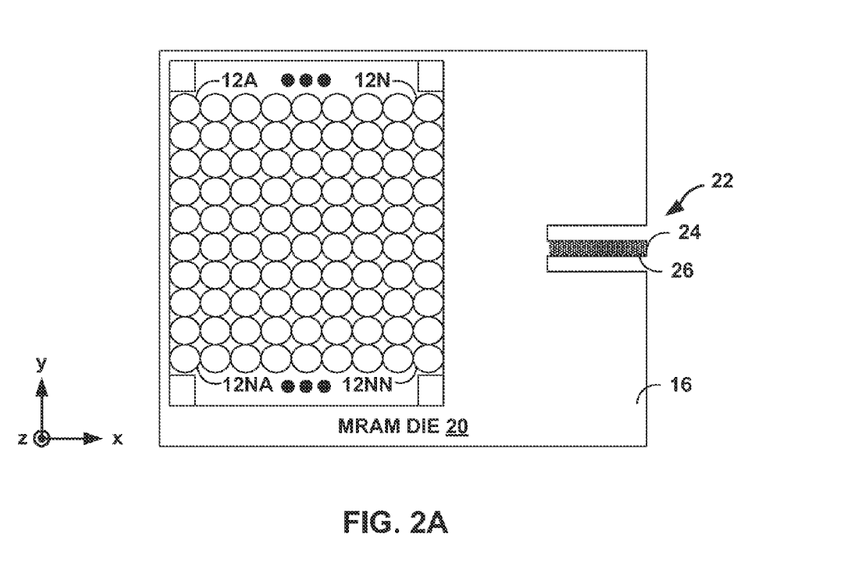
FIGS. 2A-2C are conceptual and schematic diagrams that illustrate an example MRAM die including an array of MRAM cells and a magnetic field sensing structure.
Figure 2B:
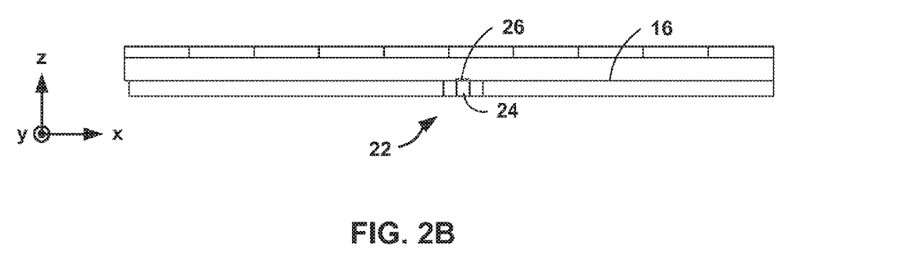
Figure 2C:
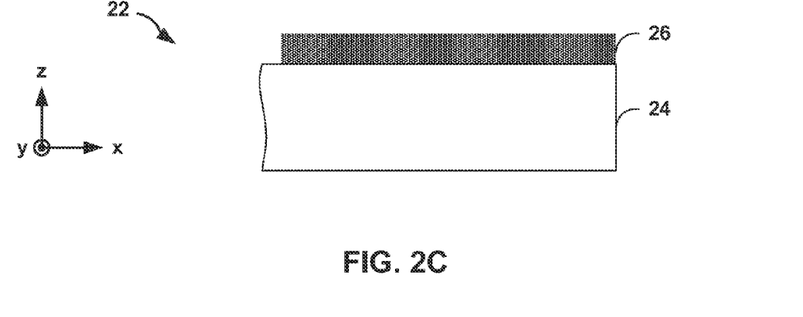

In some examples, the movable portion of magnetic field sensing structure 14 may include a cantilever. FIGS. 2A-2C are conceptual and schematic cross-sectional diagrams that illustrate an example MRAM die 20 including an array of MRAM cells 12 and magnetic field sensing structure 22 including movable portion 24 including a cantilever. The configuration of MRAM die 20 shown in FIGS. 2A-2C is similar to the configuration of MRAM die 10 in FIG. 1, aside from the differences described herein. For example, unlike magnetic field sensing structure 14 shown in FIG. 1, magnetic field sensing structure 22 shown in FIGS. 2A-2C includes movable portion 24 and magnetic material 26.

In the example illustrated in FIGS. 2A-2C, movable portion 22 includes a cantilever formed in the substrate 16 of MRAM die 20. Magnetic material 26 is attached to movable portion 24.

The thickness and amount of magnetic material 26 may be selected so that movable portion 24 moves in response to magnetic material 26 being exposed to an external (or applied) magnetic field. For example, magnetic material 26 may have a predetermined magnetic moment, which results in an amount of force being applied by magnetic material 26 to movable portion 24 when magnetic material 26 is exposed to an external (or applied) magnetic field of a certain strength. For a given magnetic material having certain magnetic properties, the volume of magnetic material 26 may affect the total amount of force applied to movable portion 24. Thus, the type and amount of magnetic material 26 may be selected such that movable portion 24 moves a predetermined amount in response to being exposed to a magnetic field having a predetermined strength. Similarly, the mechanical properties of movable portion 24 (e.g., in the z-axis direction of FIGS. 2A-2C, where orthogonal x-y-z axes are shown for purposes of illustration only) and the material properties of movable portion 24 may affect the amount movable portion 24 moves in response to magnetic material 26 being exposed to an external (or applied) magnetic field of a certain strength. For example, the mechanical properties of movable portion 24 that may affect the movement of movable portion 24 may include a thickness, width, length, effective thickness, effective width, and effective length of the movable portion, and a spring constant, a Young's modulus, and a Poisson's ratio of the material from which the movable portion is formed. In some examples, the Young's modulus of movable portion 24 may be between about 100 and about 200 gigapascals (GPa). In some examples, the Poisson's ratio of movable portion 24 may be between about −1 and about +0.5, such as about +0.25. Hence, the thickness, width, and length of movable portion 24 (e.g., in the z-axis direction of FIGS. 2A-2C) and the mechanical properties of movable portion 24 may be selected such that movable portion 24 moves a predetermined amount in response to being exposed to a magnetic field having a predetermined strength. Because magnetic material 26 applies a force to movable portion 24 upon being exposed to an external magnetic field, and the force is related to the magnetic field strength of the external magnetic field, the distance movable portion 24 moves may be related to the magnetic field strength.

In some examples, movable portion 24 may be configured to break in response to exposure of magnetic material 26 to a magnetic field above a threshold magnetic field. The threshold magnetic field at which movable portion breaks may be designed based on the amount and type of magnetic material 26 and the thickness, width, length, and material properties of movable portion 24, similar to the discussion above. In some examples, the threshold magnetic field strength may be the magnetic field strength that may magnetically reorient MRAM cells 12 or magnetic structures used to reorient MRAM cells 12. In this way, magnetic field sensing structure 22 may be used to indicate tampering with MRAM cells 12 on MRAM die 20 or completion of a manufacturing step that includes reorienting magnetic moments of one or more layers of MRAM cells 12.

MRAM die 20 may be formed using semiconductor processing techniques. In some examples, magnetic field sensing structure 22 also may be formed using semiconductor processing techniques. For example, a surface of MRAM die 20 may be masked to define the shape of movable portion 18 in the x-y plane of FIGS. 2A-2C. After masking MRAM die 20, a portion of MRAM die 20 may be etched to form movable portion 24 (e.g., form the cantilever structure). After forming movable portion 24, magnetic material 26 may be deposited on movable portion 24, e.g., using chemical vapor deposition, sputtering, ion beam deposition, or the like.

Figure 3A:
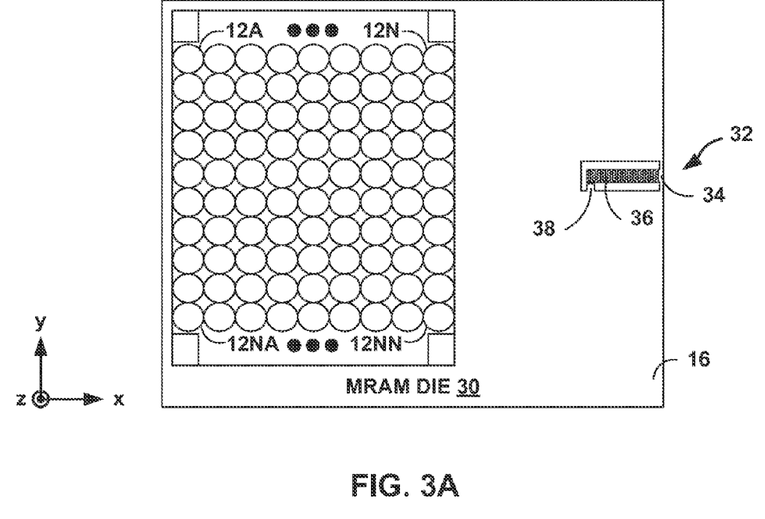
FIGS. 3A-3C are conceptual and schematic diagrams that illustrate another example MRAM die including an array of MRAM cells and a magnetic field sensing structure.
Figure 3B:
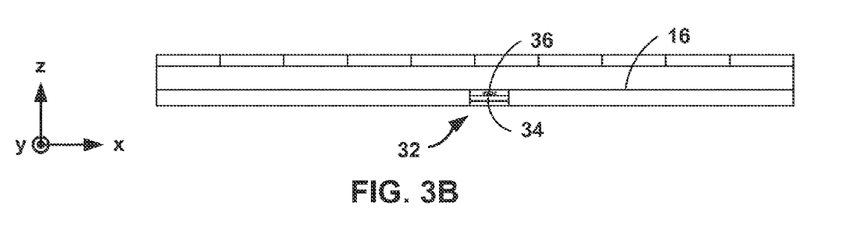
Figure 3C:
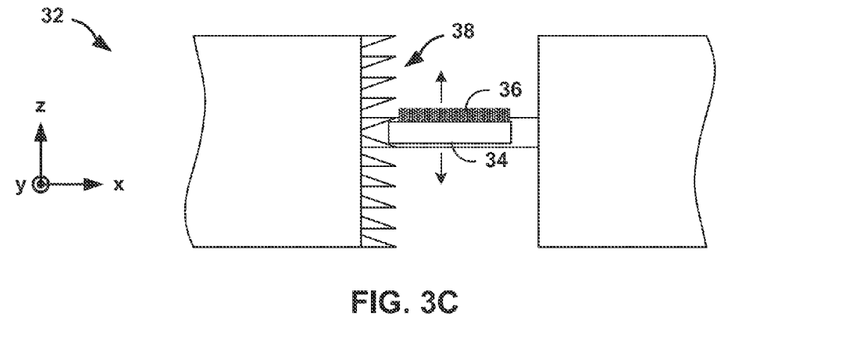

In some examples, the movable portion of the magnetic field sensing structure (e.g., magnetic field sensing structure 14) may be used together with a structure that restricts the movable portion from returning to a previous position when the magnetic field strength of an external magnetic field is reduced. FIGS. 3A-3C are conceptual and schematic cross-sectional diagrams that illustrate another example MRAM die 30 including an array of MRAM cells 12 and magnetic field sensing structure 32. The configuration shown in FIGS. 3A-3C may be similar to the configuration of MRAM die 10 illustrated in FIG. 1, aside from the differences described herein. For example, unlike magnetic field sensing structure 14 shown in FIG. 1, magnetic field sensing structure 32 includes movable portion 34, magnetic material 36, and rack 38 including asymmetric teeth.

In some examples, movable portion 34 may include a hinged structure formed from or attached to substrate 16 of MRAM die 30. In other examples, movable portion 34 may include a cantilever that possesses sufficient flexibility to bend a predetermined amount without breaking.

Magnetic material 36 is attached to movable portion 34. Magnetic material 36 may be similar to or substantially the same as magnetic material 26 (FIGS. 2A-2C) or the magnetic material described with respect to FIG. 1.

Rack 38 includes a plurality of asymmetric teeth. The asymmetric teeth in rack 38 may be positioned such that movable portion 34 moves past a respective tooth in response to being exposed to a magnetic field above a respective threshold magnetic field strength. For example, the distance that movable portion 34 moves in response to being exposed to a magnetic field of a certain magnetic field strength may be determined based on the amount (e.g., volume) and magnetic properties of magnetic material 36; the mechanical properties, thickness, or both of movable portion 34; and any resistance to movement caused by the teeth of rack 38. The respective teeth then may be formed in rack 38 at predetermined locations such that movable portion 34 moves past a respective tooth when magnetic material 36 is exposed to a magnetic field above a respective threshold magnetic field strength.

In this way, the space between each adjacent pair of teeth in rack 38 may correspond to magnetic material 36 being exposed to an external magnetic field between the threshold magnetic field strength of the respective tooth that movable portion 34 moved beyond and the threshold magnetic field strength of the respective tooth that movable portion 34 did not move beyond. In this way, rack 38 may provide additional information regarding any magnetic field to which magnetic material 36 has been exposed. In some examples, the position of movable portion 34 relative to rack 38 may indicate a range of the maximum magnetic field strength to which MRAM die 30 has been exposed.

In some examples, rather than including a rack 38 including a plurality of asymmetrical teeth, magnetic field sensing structure 32 may include another structure that, together with movable portion 34, forms a ratchet. For example, movable portion 34 may include a hinged structure, and the hinge may include one or more structural features that restrain movement of movable portion 34 in one direction. In some examples, the one or more structural features may include beveled spikes or protrusions that allow the hinge to rotate in a first direction, but resist rotation of the hinge in the second, opposite direction. Although the structure is different, the effect may be similar to or substantially the same as a ratchet formed using rack 38 and movable portion 34. For example, the hinge including beveled spikes or protrusions may result in the position of movable portion 34 indicating a range of the maximum magnetic field strength to which MRAM die 30 has been exposed.

Similar to MRAM die 20, MRAM die 30 may be formed using semiconductor processing techniques. For example, MRAM die 30 may be formed using a combination of etching, masking, chemical vapor deposition, and the like.

Figure 4A:
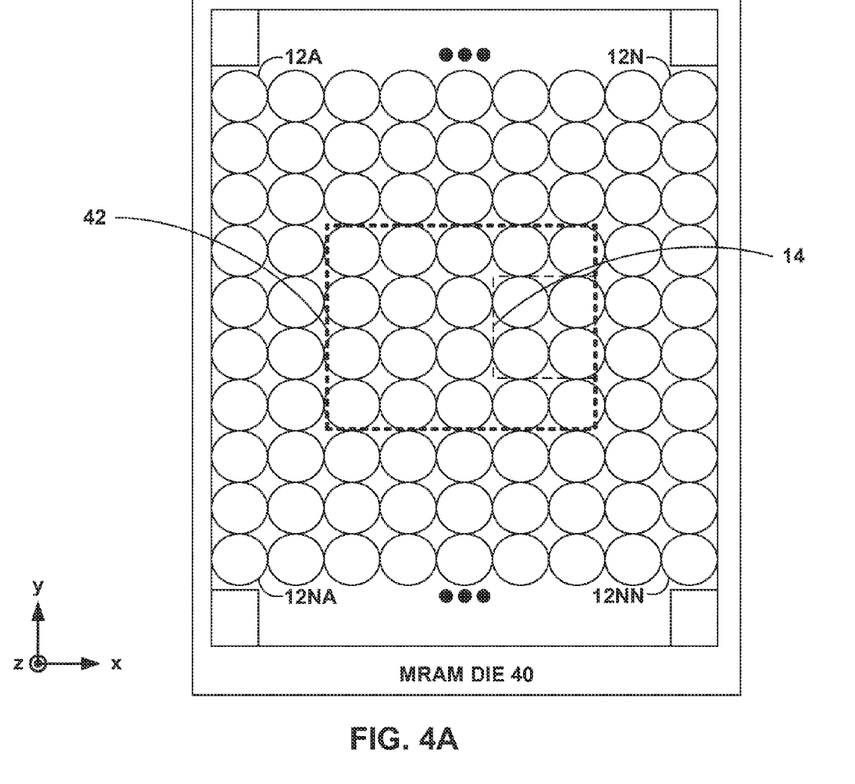
FIGS. 4A-4B are conceptual diagrams that illustrate another example MRAM die including an array of MRAM cells and a magnetic field sensing structure.
Figure 4B:
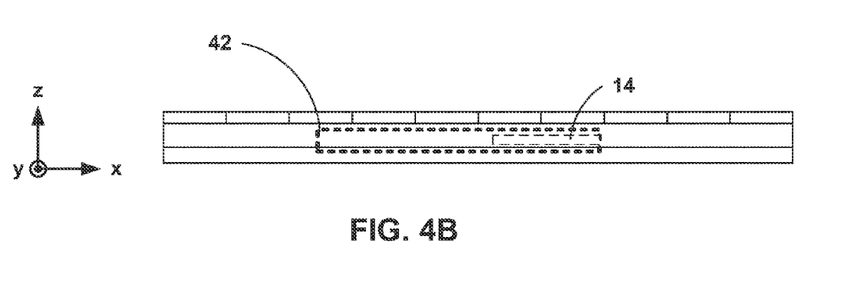

In some examples, the magnetic field sensing structure (e.g., magnetic field sensing structure 14 of FIG. 1) may be formed in an MRAM die in a location that is not visible from the outside of the MRAM die after manufacture of the MRAM die. FIGS. 4A-4B are conceptual diagrams that illustrate another example MRAM die 40 that includes an array of MRAM cells 12 and magnetic field sensing structure 14. The configuration shown in FIGS. 4A-4B may be similar to or substantially the same as the configuration of MRAM die 10 with magnetic field sensing structure 14 in FIG. 1 aside from the differences described herein. However, unlike MRAM die 10 shown in FIG. 1, MRAM die 40 shown includes covered well 42 beneath MRAM cells 12, and magnetic field sensing structure 14 is located within covered well 42.

Covered well 42 may be defined by the substrate of MRAM die 40. Covered well 40 may be located anywhere within MRAM die 40 where sensing an external magnetic field is desired. For example, covered well 42 may be located below MRAM cells 12, such that the surface MRAM die 40 that includes MRAM cells 12 covers covered well 42. In other examples, covered well 42 may be located in a portion of MRAM die 40 adjacent to MRAM cells 12, such that MRAM cells 12 do not cover covered well 42, but a different portion of MRAM die 40 covers covered well 42.

Covered well 42 includes one or more magnetic field sensing structures 14. Magnetic field sensing structure 14 may be located anywhere in covered well 42 where sensing an external magnetic field is desired. As illustrated in FIGS. 4A-4B, in some examples, magnetic field sensing structure 14 may be attached to a side of covered well 42. In some examples, magnetic field sensing structure 14 may be attached to a lower or upper surface of covered well 42.

Magnetic field sensing structure 14 may include any of the magnetic field sensing structures described herein. For example, magnetic field sensing structure 14 may include a cantilever configured to move or break in response to a magnetic material being exposed an external magnetic field (e.g., an external magnetic field having a magnetic field strength greater than a threshold magnetic field strength). As another example, magnetic field sensing structure 14 may include a cantilever or hinged structure and a rack including a plurality asymmetric teeth. As another example, magnetic field sensing structure 14 may include a hinged structure including a hinge with beveled spikes or protrusions. By locating magnetic field sensing structure 14 within covered well 42, magnetic field sensing structure 14 may not be visible when viewing the external surfaces of MRAM die 40. This may reduce a likelihood that a person attempting to tamper with MRAM die 40 will discover magnetic field sensing structure 14 while tampering with MRAM die 40.

Covered well 42 and magnetic field sensing structure 14 may be formed using semiconductor processing techniques. For example, a first substrate may be masked to define the shape of covered well 30 and magnetic field sensing structure 14 in the x-y plane of FIG. 4A (where orthogonal x-y-z axes are shown in FIGS. 4A and 4B for illustration only). After masking the first substrate, MRAM die 40 may be etched to form covered well 42 and magnetic field sensing structure 14. After forming covered well 42 and magnetic field sensing structure 14, a second substrate may be attached to the first substrate to form a cover of covered well. MRAM cells 12 may be formed in the first substrate or the second substrate, and may be formed before or after the first and second substrates are joined. In this way, covered well 42 and magnetic field sensing structure 14 may not be visible external to MRAM die 40.

Figure 5:
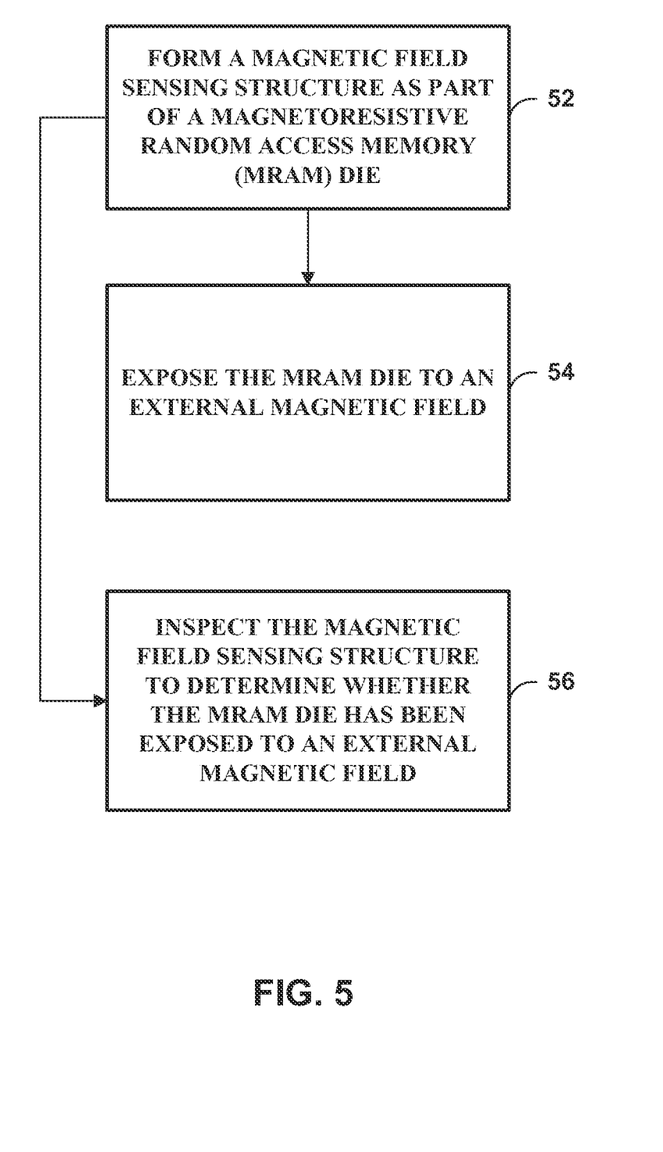
FIG. 5 is a flow diagram illustrating an example technique that may be implemented to form an MRAM die that includes a magnetic field sensing structure.

FIG. 5 is a flow diagram illustrating example technique for forming an MRAM die that includes magnetic field sensing structure 14, and, optionally, using magnetic field sensing structure 14 to determine whether the MRAM die has been exposed to an external magnetic field. An example of the technique shown in FIG. 5 will be described with reference to MRAM die 20 of FIG. 2. However, the technique shown in FIG. 5 may be extended or modified to produce an MRAM die having a configuration other than that shown in FIG. 2, such as MRAM dice 10, 30, or 40. Alternatively, MRAM die 20 may be formed using a different technique.

The technique of FIG. 5 includes forming magnetic field sensing structure 22 as part of MRAM die 20 (52). In some examples, forming magnetic field sensing structure 22 includes forming movable portion 24 of MRAM die 20, and attaching magnetic material 26 to movable portion 24. In some examples, as described above, movable portion 24 may be formed using matching and etching of a substrate, such as a semiconductor substrate, to form a cantilever. In other examples, movable portion 24 may be formed to include a hinge and a structure such as a flap attached to the hinge. The hinge may movably attach the flap to substrate 16 of MRAM die 20.

In some examples, movable portion 24 includes a cantilever including a predetermined thickness, which may be based on, for example, requirements for moving or breaking movable portion 24 in response to an external magnetic field greater than or equal to a threshold magnetic field strength.

Once movable portion 24 has been formed, magnetic material 26 may be attached to at least a portion of movable portion 24 to define a layer or pattern of magnetic material 26. As described above, the amount (e.g., volume) and type of magnetic material 26, may be based on, for example, requirements for moving or breaking movable portion 24 in response to magnetic material 26 being exposed to an external magnetic field greater than or equal to a threshold magnetic field strength. Magnetic material 26 may be attached using any suitable process, including, but not limited to, chemical vapor deposition (CVD), sputtering, ion beam deposition, or the like. Magnetic material 26 may include, for example, a linear magnetic material, and, in some examples, may have a relative magnetic permeability of at least about 10, at least about 100, or at least about 1,000.

In some examples, to form magnetic field sensing structure 32 described with reference to FIGS. 3A-3C, forming magnetic field sensing structure 32 (52) may further include forming rack 38 including asymmetric teeth as part of MRAM die 30. In some examples, rack 38 may be formed using an etching or machining process, or may be formed separate from MRAM die 30 and attached to MRAM die 30.

In some examples, the technique of FIG. 5 may optionally include exposing MRAM die 20 to an external magnetic field (54). In some examples, if the external magnetic field is above a threshold magnetic field strength, exposing MRAM die 20 to an external magnetic field (54) may cause movable portion 24 to break. In other examples, as described in FIGS. 3A-3C, if the external magnetic field is above a respective threshold magnetic field strength, exposing MRAM die 30 to an external magnetic field (54) may cause movable portion 34 to move to a position between two adjacent teeth of rack 38, where the position depends on the magnetic field strength of the external magnetic field. In some examples, exposing MRAM die 20 to an external magnetic field (54) may be an intentional step in a manufacturing technique. In other examples, exposing MRAM die 20 to an external magnetic field (54) may be an intentional step in a manufacturing technique may be an unintentional action. In other examples, exposing MRAM die 20 to an external magnetic field (54) may be an intentional step in an attempted tampering with MRAM die 20.

In some examples, the technique of FIG. 5 may optionally include inspecting magnetic field sensing structure 22 to determine whether MRAM die 20 has been exposed to the external magnetic field (56). This step may be in addition to or as an alternative to exposing MRAM die 20 to an external magnetic field (54). In some examples, inspecting magnetic field sensing structure 20 (56) may include optically viewing at least one of a position or a connection of magnetic field sensing structure 22 with respect to MRAM die 20. In some examples, as described in FIG. 4A, inspecting magnetic field sensing structure 14 may further include accessing magnetic field sensing structure 14 within covered well 42 of MRAM die 40. By inspecting magnetic field sensing structure 14, 22, or 32, the inspector may ascertain information related to exposure of magnetic field sensing structure 14, 22, or 32 to an external magnetic field.

Various examples of the disclosure have been described. These and other examples are within the scope of the following claims.

What is claimed is:
1. A magnetoresistive random access memory (MRAM) die comprising:
   a plurality of MRAM cells; and
   a magnetic field sensing structure comprising a movable portion and a magnetic material attached to the movable portion, wherein the movable portion moves in response to exposure of the magnetic material to an external magnetic field, and wherein, upon the moveable portion moving in response to exposure of the magnetic material to the external magnetic field above a threshold magnetic field strength, the magnetic field sensing structure is configured such that the moveable portion is prevented from returning to a previous position.

2. The device of claim 1, wherein the movable portion comprises at least one of a cantilever or a hinged structure.

3. The device of claim 1, wherein the movable portion comprises the hinged structure, wherein the MRAM die further comprises a rack including asymmetric teeth, wherein the rack including asymmetric teeth prevents the movable portion from returning to the previous position after the movable portion moves in response to exposure of the magnetic material to the external magnetic field above the threshold magnetic field strength.

4. The device of claim 3, wherein the rack including asymmetric teeth comprises a plurality of positions, each position between respective adjacent asymmetric teeth, and wherein the rack including asymmetric teeth is constructed such that the external magnetic field above the threshold magnetic field strength causes the movable portion of the magnetic field sensing structure to move to a respective position of the plurality of positions.

5. The device of claim 1, wherein the magnetic material comprises a linear magnetic material.

6. The device of claim 1, wherein the magnetic material comprises a nickel-iron-molybdenum (NiFeMo) alloy.

7. The device of claim 1, further comprising a substrate, wherein the substrate and the magnetic field sensing structure comprise silicon.

8. The device of claim 7, wherein the substrate defines a covered well, and wherein the magnetic field sensing structure is located within the covered well.

9. The device of claim 1, wherein the movable portion comprises the cantilever, and wherein the cantilever is configured to break when the magnetic material is exposed to the external magnetic field above the threshold magnetic field strength.

10. A method comprising:
forming a magnetic field sensing structure as part of a magnetoresistive random access memory (MRAM) die, wherein the MRAM die comprises a plurality of MRAM cells, and wherein forming the magnetic field sensing structure comprises:
forming a movable portion of the MRAM die; and
attaching a magnetic material to the movable portion, wherein the movable portion moves in response to exposure of the magnetic material to an external magnetic field, and wherein, upon the moveable portion moving in response to exposure of the magnetic material to the external magnetic field above a threshold magnetic field strength, the magnetic field sensing structure is configured such that the moveable portion is prevented from returning to a previous position.

11. The method of claim 10, wherein forming the movable portion comprises forming at least one of a cantilever or a hinged structure.

12. The method of claim 11, further comprising forming a rack including asymmetric teeth as part of the MRAM die, wherein the rack including asymmetric teeth prevents the movable portion from returning to a previous position after the movable portion moves in response to exposure of the magnetic material to the external magnetic field above the threshold magnetic field strength.

13. The method of claim 12, wherein forming the rack including the asymmetric teeth further comprises forming a plurality of positions, each position between respective adjacent asymmetric teeth.

14. The method of claim 13, wherein the rack including asymmetric teeth is constructed such that the external magnetic field of the respective threshold magnetic field strength causes the movable portion of the magnetic field sensing structure to move to a respective position of the plurality of positions.

15. The method of claim 10, further comprising exposing the MRAM die to the external magnetic field.

16. The method of claim 15, further comprising breaking the movable member when the movable member is exposed to the external magnetic field above the threshold magnetic field strength.

17. The method of claim 15, further comprising ratcheting the movable portion when the movable portion is exposed to the external magnetic field above the threshold magnetic field strength.

18. The method of claim 10, further comprising inspecting the magnetic field sensing structure to determine whether the MRAM die has been exposed to the external magnetic field above the threshold magnetic field strength.

19. The method of claim 18, wherein inspecting the magnetic field sensing structure further comprises optically viewing at least one of a position or a connection of the magnetic field sensing structure with respect to the MRAM die.

* * * * *